United States Patent
Kimura

(10) Patent No.: US 8,217,673 B2
(45) Date of Patent: Jul. 10, 2012

(54) METHOD AND CIRCUIT FOR TESTING INTEGRATED CIRCUIT

(75) Inventor: Hiroyuki Kimura, Sendai (JP)

(73) Assignee: Freescale Semiconductor, Inc., Austin, TX (US)

( * ) Notice: Subject to any disclaimer, the term of this patent is extended or adjusted under 35 U.S.C. 154(b) by 402 days.

(21) Appl. No.: 12/552,288

(22) Filed: Sep. 2, 2009

(65) Prior Publication Data

US 2011/0050272 A1    Mar. 3, 2011

(51) Int. Cl.
*G01R 31/10* (2006.01)

(52) U.S. Cl. .......... 324/750.3; 324/760.02; 324/762.02; 714/30; 714/733; 326/80; 326/102; 327/333

(58) Field of Classification Search .......... 324/750.3, 324/760.02, 762.01–762.06; 714/30, 733; 326/80, 102; 327/333
See application file for complete search history.

(56) References Cited

U.S. PATENT DOCUMENTS

| | | | |
|---|---|---|---|
| 2005/0088125 A1* | 4/2005 | Bliley et al. | 318/254 |
| 2007/0297204 A1* | 12/2007 | Lu et al. | 363/131 |
| 2009/0079273 A1* | 3/2009 | Kumfer et al. | 307/113 |
| 2009/0134904 A1* | 5/2009 | Zjajo et al. | 324/765 |

FOREIGN PATENT DOCUMENTS

| | | |
|---|---|---|
| JP | 2000-244298 A | 9/2000 |
| JP | 2004-226115 A | 8/2004 |
| JP | 2008-060494 A | 3/2008 |

* cited by examiner

*Primary Examiner* — Arleen M Vazquez
(74) *Attorney, Agent, or Firm* — Charles Bergere

(57) ABSTRACT

A test controller switches the operation of output stages in an integrated circuit between a normal operation mode and a test mode. The output stages are respectively connected to switch elements. A level shifter generates a switch signal for controlling activation and deactivation of the switch elements in accordance with the normal operation mode and the test mode.

16 Claims, 2 Drawing Sheets

METHOD AND CIRCUIT FOR TESTING INTEGRATED CIRCUIT

BACKGROUND OF THE INVENTION

The present invention relates to a method and circuit for testing an integrated circuit (IC), and more particularly, to testing the on-resistance of a transistor.

To guarantee that an IC operates properly, the properties of a transistor must be accurately evaluated during a testing stage. In the prior art, the on-resistance of a transistor is measured as an evaluation index.

Japanese Laid-Open Patent Publication No. 2004-226115 describes a method for measuring the resistances of a plurality of output circuits in an IC. In this publication, two of the plurality of output circuits are selectively used during a test, and the on-resistances of the two output transistors forming each output circuit are measured by conducting a four-terminal measurement. One of the two selected output circuits serves as a device under test (DUT), and the other one of the two selected output circuits serves as a reference device that is used with the DUT to measure the on-resistances of the output transistors in the DUT. The output circuits are connected in parallel between a VDD line, which is connected to a VDD terminal, and a GND line, which is connected to a GND line.

During the test, the two transistors of the DUT are both activated, and the two output transistors of the reference device are selectively activated. The voltage and current applied to each output transistor of the DUT is measured using an output terminal of the DUT, an output terminal of the reference device, the VDD terminal, and the GND terminal. The on-resistance is calculated using the voltage and current applied to each output transistor of the DUT. However, the DUT and reference device, that is, the plurality of output circuits are connected to a common power line (VDD line). Thus, in the prior art, the test cannot be conducted when the VDD line is broken. Further, this prior art testing method cannot be directly applied to a multi-power IC, in which a plurality of output circuits are connected to different power lines, such as a multichannel DC/DC converter that generates different power levels. Accordingly, the application of the prior art testing method is restricted since it is dependent on the power supplied to the IC.

Japanese Laid-Open Patent Publication No. 2008-60494 describes a test circuit for measuring the resistance of a motor driver such as an H-bridge. The four-terminal measurement is also conducted in this publication using the test circuit with the H-bridge to measure the on-resistances of four drive transistors that form the H-bridge. The H-bridge is connected to two power terminals, which respectively supply the H-bridge with a high potential voltage and a low potential voltage, and two output terminals, which output in a complementary manner the drive voltage generated by the H-bridge. The test circuit includes four switch elements, each of which is formed by an NMOS transistor. The four switch elements are each connected to a different one of the four terminals of the H-bridge.

During a test, the test circuit selectively activates one of the four switch elements (NMOS transistors) to sequentially measure the voltages of the four terminals of the H bridge through a source-drain path of each switch element. The on-resistance of each drive transistor is calculated from the voltage (measured voltage at two points) and current applied to the drive transistor. In this test circuit, the back gate of each switch element is connected to ground to prevent leakage current from flowing to the switch element during normal operation of a motor driver. In other words, the substrate bias of each switch element is controlled to improve the off property (source-drain disconnection) of each switch element. This prevents the flow of leakage current through each switch element when the switch element is activated. However, to control the gate of each switch element, the test circuit requires another voltage source to supply a voltage that is higher than the voltage (IC power) for controlling the drive transistors of the H-bridge. Therefore, when the voltage value of the IC power becomes high, the structure of the test circuit becomes complicated.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
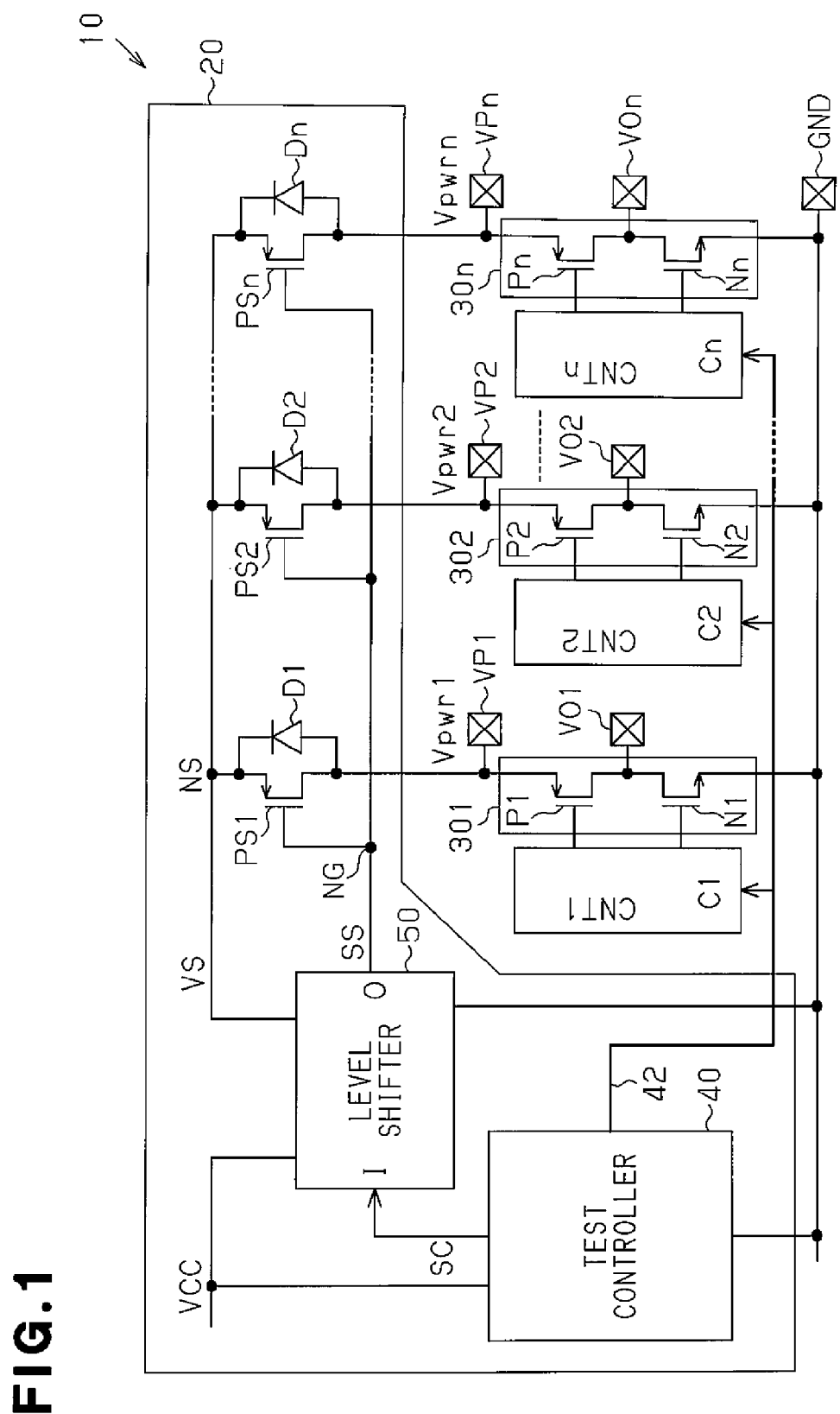
FIG. 1 is a schematic circuit block diagram of an integrated circuit including a test circuit in accordance with an embodiment of the present invention.

In the drawings like numerals are used for like elements throughout.

One aspect of the present invention is a test circuit for testing an IC including a plurality of output stages. A test controller switches operation of the plurality of output stages between a normal operation mode and a test mode. A plurality of switch elements is respectively connected to the plurality of output stages. A level shifter generates a switch signal for controlling activation and deactivation of the plurality of switch elements in accordance with the normal operation mode and the test mode.

A further aspect of the present invention is an integrated circuit including a plurality of output stages. A test controller switches operation of the plurality of output stages between a normal operation mode and a test mode. A plurality of switch elements is respectively connected to the plurality of output stages. A level shifter generates a switch signal that controls activation and deactivation of the plurality of switch elements in accordance with the normal operation mode and the test mode.

Another aspect of the present invention is a method for testing an IC including first and second output stages. The method includes switching operation of the first and second output stages between a normal operation mode and a test mode with a test controller, activating first and second switch elements respectively connected to the first and second output stages in the test mode, and selectively measuring resistance of the first output stage and resistance of the second output stage by performing a four-terminal measurement when the first and second switch elements are activated.

Other aspects and advantages of the present invention will become apparent from the following description, taken in conjunction with the accompanying drawings, illustrating by way of example the principles of the invention.

An integrated circuit (IC) 10 including a test circuit 20 in accordance with an embodiment of the present invention will now be discussed with reference to the drawings. The IC 10 may be a multi-power level IC. One example of a multi-power level IC is a multi-channel DC-DC converter and the test circuit 20 is used to measure the resistances of a plurality of output stages of the DC-DC converter.

Referring to FIG. 1, a schematic circuit diagram of the test circuit 20 in the IC 10 is shown. The IC 10 includes at least two output stages 30 (301, 302, . . . 30n in FIG. 1), with different output voltages. The output stages 301, 302, . . . 30n respectively include first output transistors P1, P2, . . . Pn, which are formed by P-channel MOS transistors, and second output transistors N1, N2, . . . Nn, which are formed by N-channel MOS transistors.

The sources of the first output transistors P1, P2, . . . Pn are respectively connected to power pads VP1, VP2, . . . VPn. The power pads VP1, VP2, . . . VPn are respectively connected to power lines (not shown) that supply different voltages. For example, the power pads VP1, VP2, . . . VPn are respectively supplied with power voltages Vpwr1, Vpwr2, . . . Vpwrn, which are in the relationship of "Vpwr1>Vpwr2> . . . > Vpwrn."

The sources of the second output transistors N1, N2, . . . Nn are connected to a ground pad GND. The drains of the second output transistors N1, N2, . . . Nn are respectively connected to the drains of the first output transistors P1, P2, . . . Pn and to output pads VO1, VO2, Von.

The output stages 301, 302, . . . 30n are respectively controlled by control circuits CNT1, CNT2, . . . CNTn. That is, the first and second output transistors P and N arranged in each output stage 30 are activated and deactivated by the control circuit CNT. For example, when the IC 10 is operating normally, each control circuit CNT activates the first output transistor P and deactivates the second output transistor N to generate voltage corresponding to the level of the power voltage Vpwr at the output terminal VO of the output stage 30. Otherwise, the control circuit CNT deactivates the first output transistor P and activates the second output transistor N to generate voltage having ground level at the output terminal VO of the output stage 30. Although not shown in FIG. 1, the IC 10 includes circuits other than the control circuits CNT1, CNT2, . . . CNTn and output stages 301, 302, . . . 30n.

The test circuit 20 includes a test controller 40, a level shifter 50, and at least two switch elements PS (PS1, PS2, . . . PSn in FIG. 1). The test controller 40 switches the IC 10 between a normal operation mode and a test mode in response to a mode signal (not shown). The test controller 40 provides through a control path 42 the control circuits CNT1, CNT2, . . . CNTn with control signals C1, C2, . . . Cn, respectively. Each control circuit CNT controls the first and second output transistors P and N in response to the control signal C.

More specifically, when entering the normal operation mode, each control circuit CNT controls the first and second output transistors P and N based on input data (now shown) in response to the control signal C. When entering the test mode, one of the output stages 301, 302, . . . 30n is selectively designated as a device under test (DUT) based on test control signals C1, C2, . . . Cn. In this state, the control circuit CNT that controls the DUT (e.g., output stage 301) activates both of the first and second output transistors P and N (P1 and N1) in response to the test control signal C (C1). Further, the output stages 30 that were not designated as the DUT each deactivate the first and second output transistors P and N in response to the test control signal C.

The level shifter 50 is connected to the test controller 40 and the switch elements PS1, PS2, . . . PSn. The level shifter 50 is supplied with a first voltage VCC, which serves as a logic power level for the IC 10, and a second voltage VS, which is for deactivating the switch elements PS1, PS2, . . . PSn. The first voltage VCC and the second voltage VS are used as power voltages for the level shifter 50. As will be described in detail below, the second voltage VS is dynamically generated in a manner dependent on the values of the power voltages Vpwr1, Vpwr2, . . . Vpwrn that are set by the IC 10. Further, the level shifter 50 is provided with a switch control signal SC from the test controller 40.

In an embodiment of the invention, the switch control signal SC is set at a VCC level (first voltage VCC) during the normal operation mode and set at a ground level during the test mode. Based on the switch control signal SC, the level shifter 50 generates a switch signal SS to switch the switch elements PS1, PS2, . . . PSn between activated and deactivated states. More specifically, the level shifter 50 generates the switch signal SS with a VS level (second voltage VS) in response to a switch control signal SC having the VCC level (during the normal operation mode) and generates the switch signal SS with a ground level in response to a switch control signal SC having a ground level (during the test mode).

The switch elements PS1, PS2, . . . PSn are each formed by a P-channel MOS transistor. The drains of the switch elements PS1, PS2, . . . PSn are respectively connected to the sources of the first output transistors P1, P2, . . . Pn. The sources of the switch elements PS1, PS2, . . . PSn are connected to one another and have a common source node NS. The second voltage VS, which is supplied to the level shifter 50, is generated at the common source node NS. That is, based on the second voltage VS generated at the source node NS of the switch elements PS1, PS2, . . . PSn, the level shifter 50 determines the voltage level of the switch signal SS in the normal operation mode.

The gates of the switch elements PS1, PS2, . . . PSn are connected to one another and have a common gate node NG. The common gate node NG is connected to an output node of the level shifter 50 that outputs the switch signal SS. That is, the level shifter 50 controls the gates of the switch elements PS1, PS2, . . . PSn with the same switch signal SS. As described above, in the normal operation mode, the level shifter 50 adjusts the switch signal SS to a level that is the same as the second voltage VS. This electrically short-circuits the gates (NG) and sources (NS) of the switch elements PS1, PS2, . . . PSn via the level shifter 50.

The switch elements PS1, PS2, . . . PSn respectively include parasitic body diodes D1, D2, . . . Dn. The body diodes D are each connected to the switch element PS so as to form a forward bias directed from the drain toward the source in the switch element PS.

The operation of the IC 10 in the normal operation mode and the test mode will now be discussed.

[Normal Operation Mode]

When entering the normal operation mode, the test controller 40 provides the level shifter 50 with a switch control signal SC having a VCC level. In response to the switch control signal SC, the level shifter 50 generates a switch signal SS having the same level as the second voltage VS. The second voltage VS has the level of the common source node NS of the switch elements PS1, PS2, . . . PSn. Accordingly, the switch elements PS1, PS2, . . . PSn are all deactivated. Thus, the output stages 301, 302, . . . 30n are electrically disconnected from one another.

In the normal operation mode, each of the control circuits CNT controls each of the first and second transistors P and N based on input data (not shown) in response to the output control signal C. Accordingly, the IC 10 operates independently from the test circuit 20.

The operations of the switch elements PS and the level shifter 50 during the normal operation mode will now be discussed.

In the test circuit 20, the level of the second voltage VS is determined in a manner dependent on the values of the power voltages Vpwr1, Vpwr2, ... Vpwrn. For example, if the power voltages Vpwr1, Vpwr2, ... Vpwrn satisfy the relationship of "Vpwr1>Vpwr2> ... >Vpwrn," the second voltage VS is generated at the common source node NS with a level that is substantially the same as or slightly lower than the power voltage Vpwr1, which has the maximum voltage value. More specifically, in this state, the voltage generated at the source of the switch element PS1 is lower than the power voltage Vpwr1 by an amount corresponding to the voltage decreased by the body diode D1. In the same manner, the voltages generated at the sources of the switch elements PS2, ... PSn are also respectively lower than the power voltages Vpwr2, ... Vpwrn. However, the value of the power voltage Vpwr1 is greater than the values of the other power voltages Vpwr2, ... Vpwrn. Thus, the second voltage VS is generated at the common source node NS with the same level as the source voltage of the switch element PS1. In this manner, the level of the second voltage VS varies in a manner dependent on the one of the power voltages Vpwr1, Vpwr2, ... Vpwrn that has the maximum voltage value.

In the normal operation, the voltage level of the switch signal SS follows the level of the second voltage VS due to the level shifter 50. Accordingly, even if forward bias is applied to the body diode D1, the gate-source voltage VGS of the switch element PS1 is controlled to be substantially zero. Thus, the switch element PS1 is maintained in a deactivated state by the switch signal SS that has the VS level. However, the switch element PS1 becomes substantially conductive due to the body diode D1. As for the switch elements PS2, ... PSn, a reverse bias is applied to each of the body diodes D2, ... Dn. This ensures that the switch elements PS2, ... PSn are maintained in a deactivated state by the switch signal SS having the VS level. Therefore, even if the node NS is connected to the power pad VP1 via the body diode D1, the switch elements PS2, ... PSn disconnect the node NS from the power pads VP2, ... VPn. In entirety, this disconnects the power pads VP1, VP2, ... VPn from one another. Accordingly, the structure of the test circuit 20 (including the test controller 40, the level shifter 50, and at least two switch elements PS) is the same regardless of the values of the power voltages Vpwr1, Vpwr2, ... Vpwrn supplied to the IC 10. In other words, the test circuit 20 generates the gate control voltage for each switch element PS with the single level shifter 50 in a self-adjusting manner in accordance with the value of each power supply voltage of the IC 10.

[Test Mode]

When entering the test mode, the test controller 40 provides the level shifter 50 with a switch control signal SC having the ground level. In response to the switch control signal SC, the level shifter 50 generates a switch signal SS having the ground level. The second voltage VS generated at the common source node NS in the test mode also has a level that is substantially the same as the power voltage Vpwr1, which has the maximum voltage value, or a slightly lower level. Accordingly, the switch elements PS1, PS2, ... PSn are all activated. That is, the sources of the first output transistors P1, P2, ... Pn are electrically connected to one another by the switch elements PS1, PS2, ... PSn.

Figure 2:
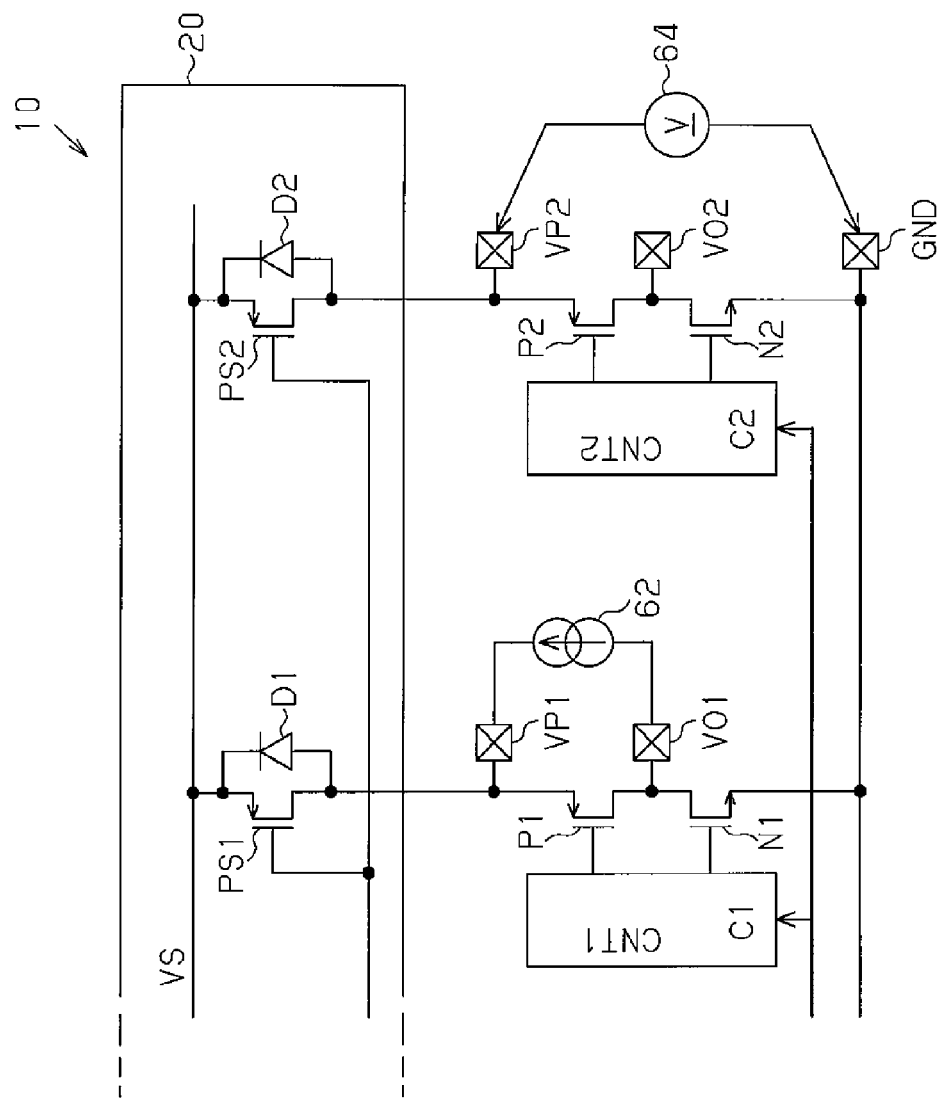
FIG. 2 is a schematic circuit block diagram illustrating an example of a four-terminal measurement performed with the test circuit of FIG. 1.

Further, based on the test control signals C1, C2, ... Cn provided from the test controller 40, one of the output stages 301, 302, ... 30n is selectively designated as the DUT. It is assumed here that, for example, the output stage 301 is selected as the DUT. In this state, the control circuit CNT1 activates both of the first and second output transistors P1 and N1. The other first output transistors P2, ... Pn and the other second output transistors N2, ... Nn are all deactivated. In this state, the resistance of the DUT (301), that is, the on-resistance of the transistors P1 and N1 may be measured through the four-terminal measurement. Hereinafter, the measurement of the on-resistance for the first output transistor P1 will be discussed with reference to FIG. 2.

In this case, a current source 62 is connected between the power pad VP1 and the output pad VO1. As a result, current corresponding to the current value of the current source 62 flows to the activated first output transistor P1. Further, a voltage meter 64 is connected between the power pad VP2 and the ground pad GND. The output transistors N1, P2, and N2 are deactivated, and the switch elements PS1 and PS2 are activated. Thus, the potential at the power pad VP2 is the same as the potential at the source of the first output transistor P1. Further, the potential at the ground pad GND is the same as the potential at the drain of the first output transistor P1. Accordingly, the voltage meter 64 shows the value of the voltage applied between the source and drain of the first output transistor P1. As a result, the on-resistance of the first output transistor P1 is measured from the current value of the current source 62 and the voltage value of the voltage meter 64 based on the Ohm's law. In the same manner, connection of the current source 62 between the output pad VO1 and the ground GND allows for measurement of the on-resistance of the second output transistor N1. Further, the resistances of the other output stages may be measured by changing the location of the DUT.

In one embodiment of the invention, the IC 10 with the test circuit 20 has the advantages described below.

(1) The test circuit 20 is incorporated in the IC 10, which includes the output stages 301, 302, ... 30n that are each connected to independent power pads. Thus, the test circuit 20 is applicable to a test for measuring the resistance (on-resistance) of each output stage in a manner independent from the value of each power for the IC 10. Accordingly, the test circuit 20 has a high degree of versatility.

(2) The single level shifter 50 controls the gates of the switch elements PS1, PS2, ... PSn. In other words, the structure of the level shifter 50 is not dependent on the quantity of powers provided for the IC 10 or the values of the powers. Thus, the test circuit 20 has a simple structure.

(3) Even if the output stages 30 are increased in quantity, the switch elements PS are only required to also be increased in quantity. This prevents an undue increase in circuit area of the test circuit 20.

(4) The test circuit 20 does not require separate pins for a resistance measurement test.

It should be apparent to those skilled in the art that the present invention may be embodied in many other specific forms without departing from the spirit or scope of the invention. Particularly, it should be understood that the present invention may be embodied in the following forms.

The power supply voltages Vpwr1, Vpwr2, ... Vpwrn are not required to have difference voltages. That is, the test circuit 20 is not restricted to a multi-power IC and is also applicable to a single-power IC. For example, the test circuit 20 is applicable to a power IC such as that described in Japanese Laid-Open Patent Publication No. 2004-226115 in which a plurality of output circuits (i.e., output stages) are connected to a common VDD line. It may be considered that the power IC of the publication has the structure shown in FIG. 1 of the present application in which the power pads VP1, VP2, ... VPn are connected to one another by the same power line. In this case, even if power lines for connection between the power pads VP1, VP2, ... VPn are broken, a test may be conducted through the four-terminal measurement using the switch elements PS1, PS2, . . . PSn respectively connected to the output stages 301, 302, . . . 30n.

The multiple power supply IC is not restricted to a multi-channel DC-DC converter.

In addition to testing a power IC, the test circuit 20 may be applied to test other ICs. For example, the test circuit 20 ma be incorporated in a driver IC including an H-bridge such as that described in Japanese Laid-Open Patent Publication No. 2008-60494. It may be considered that an H-bridge has the structure shown in FIG. 1 of the present application in which the output stages 301 and 302 are connected to a single high potential power supply and ground. That is, in this structure, the two power pads VP1 and VP2 are connected to each other by the same power line. In this case, testing may also be conducted through the four terminal measurement process using the switch elements PS1 and PS2 respectively connected to the output stages 301 and 302.

The test circuit 20 is not restricted to the output stages (output stage transistors) of an IN and may also be used to conduct a resistance measurement test on input stages. That is, the test circuit 20 is applicable to a resistance value measurement test for an I/O circuit of an IC.

The polarity of the switch signal SS may be changed, and the switch elements PS1, PS2, . . . PSn may be formed by N-channel MOS transistors.

The first output transistors P1, . . . Pn may be formed by N-channel MOS transistors. That is, each of the output stages 30 may be formed by two N-channel MOS transistors.

The present examples and embodiments are to be considered as illustrative and not restrictive, and the invention is not to be limited to the details given herein, but may be modified within the scope and equivalence of the appended claims.

The invention claimed is:

1. A test circuit for testing an integrated circuit including a plurality of output stages, the test circuit comprising:
   a test controller that switches operation of the plurality of output stages between a normal operation mode and a test mode;
   a plurality of switch elements respectively connected to the plurality of output stages; and
   a level shifter that generates a switch signal for controlling activation and deactivation of the plurality of switch elements in accordance with the normal operation mode and the test mode
   wherein:
   the plurality of output stages includes first and second output stages;
   the plurality of switch elements include first and second switch elements, each formed by a P-channel MOS transistor having a source, drain, and gate, with the gates of the first and second switch elements being connected to each other and having a common gate node, the sources of the first and second switch elements being connected to each other and having a common source node, the drain of the first switch element being connected to the first output stage, and the drain of the second switch element being connected to the second output stage; and
   the level shifter receives voltage from the common source node to generate the switch signal at the common gate node.

2. The test circuit according to claim 1, wherein the plurality of switch elements are activated by the switch signal in the test mode to electrically connect the plurality of output stages to one another through the plurality of switch elements.

3. The test circuit according to claim 1, wherein:
   the test controller selects one of the plurality of output stages as a device under test in the test mode, activates the transistors of the output stage selected as the device under test, and deactivates the transistors in each of the other ones of the plurality of output stages that have not been selected as the device under test.

4. The test circuit according to claim 1, wherein:
   the plurality of output stages are respectively supplied with different power voltages; and
   the level shifter generates the switch signal to deactivate the plurality of switch elements based on the one of the power voltages having the maximum value.

5. The test circuit according to claim 1, wherein:
   the plurality of output stages are supplied with a single power voltage; and
   the level shifter generates the switch signal to deactivate the plurality of switch elements based on the value of the single power voltage.

6. The test circuit according to claim 1, wherein the plurality of switch elements are in a quantity that is the same as that of the plurality of output stages in the integrated circuit, and the level shifter is one in quantity regardless of the quantity of the output stages.

7. The test circuit according to claim 1, wherein the level shifter generates the switch signal to deactivate the first and second switch elements based on the voltage at the common source node.

8. The test circuit according to claim 1, wherein the level shifter generates the switch signal to deactivate the first and second switch elements at a level that is the same as the voltage at the common source node.

9. The test circuit according to claim 1, wherein the level shifter deactivates the first and second switch elements in the normal operation mode and activates the first and second switch elements in the test mode.

10. An integrated circuit, comprising:
    a plurality of output stages;
    a test controller that switches operation of the plurality of output stages between a normal operation mode and a test mode;
    a plurality of switch elements respectively connected to the plurality of output stages; and
    a level shifter that generates a switch signal for controlling activation and deactivation of the plurality of switch elements in accordance with the normal operation mode and the test mode;
    wherein:
    the plurality of output stages include first and second output stages;
    the plurality of switch elements include first and second switch elements, each formed by a P-channel MOS transistor having a source, drain, and gate, with the gates of the first and second switch elements being connected to each other and having a common gate node, the sources of the first and second switch elements being connected to each other and having a common source node, the drain of the first switch element being connected to the first output stage, and the drain of the second switch element being connected to the second output stage; and
    the level shifter receives voltage from the common source node to generate the switch signal at the common gate node.

11. The integrated circuit according to claim 10, wherein the plurality of switch elements are activated by the switch signal in the test mode to electrically connect the plurality of output stages to one another through the plurality of switch elements.

12. The integrated circuit according to claim 10, wherein the plurality of switch elements are in a quantity that is the same as that of the plurality of output stages, and the level shifter is one in quantity regardless of the number of the output stages.

13. The integrated circuit according to claim 10, wherein the integrated circuit is a multi-power IC in which the plurality of output stages are respectively supplied with different power voltages.

14. The integrated circuit according to claim 13, wherein the multi-power IC is a multi-channel DC-DC converter.

15. The integrated circuit according to claim 10, wherein the integrated circuit is a single-power IC in which the plurality of output stages are supplied with a single power voltage.

16. The integrated circuit according to claim 10, wherein the integrated circuit is a driver IC including an H-bridge.

* * * * *